United States Patent
Heinrich et al.

(10) Patent No.: US 7,951,677 B2
(45) Date of Patent: May 31, 2011

(54) CORNER ROUNDING IN A REPLACEMENT GATE APPROACH BASED ON A SACRIFICIAL FILL MATERIAL APPLIED PRIOR TO WORK FUNCTION METAL DEPOSITION

(75) Inventors: Jens Heinrich, Wachau (DE); Thomas Werner, Moritzburg (DE); Frank Seliger, Dresden (DE); Frank Richter, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/894,985

(22) Filed: Sep. 30, 2010

(65) Prior Publication Data
US 2011/0104880 A1 May 5, 2011

(30) Foreign Application Priority Data

Oct. 30, 2009 (DE) .......................... 10 2009 046 250

(51) Int. Cl.
*H01L 21/336* (2006.01)
(52) U.S. Cl. ........ 438/270; 438/272; 438/640; 438/713; 257/E21.655; 257/E21.643

(58) Field of Classification Search .......... 438/270–272, 438/638–640, 713
See application file for complete search history.

(56) References Cited

U.S. PATENT DOCUMENTS

2010/0264486 A1* 10/2010 Denison et al. ............... 257/330
* cited by examiner

*Primary Examiner* — Hsien-ming Lee
(74) *Attorney, Agent, or Firm* — Williams, Morgan & Amerson, P.C.

(57) ABSTRACT

In a replacement gate approach, a top area of a gate opening has a superior cross-sectional shape which is accomplished on the basis of a plasma assisted etch process or an ion sputter process. During the process, a sacrificial fill material protects sensitive materials, such as a high-k dielectric material and a corresponding cap material. Consequently, the subsequent deposition of a work function adjusting material layer may not result in a surface topography which may result in a non-reliable filling-in of the electrode metal. In some illustrative embodiments, the sacrificial fill material may also be used as a deposition mask for avoiding the deposition of the work function adjusting metal in certain gate openings in which a different type of work function adjusting species is required.

20 Claims, 9 Drawing Sheets

CORNER ROUNDING IN A REPLACEMENT GATE APPROACH BASED ON A SACRIFICIAL FILL MATERIAL APPLIED PRIOR TO WORK FUNCTION METAL DEPOSITION

BACKGROUND OF THE INVENTION

1. Field of the Invention

Generally, the present disclosure relates to the fabrication of sophisticated integrated circuits including transistor elements comprising gate structures on the basis of a high-k gate dielectric material in combination with a metal electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 μm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold voltage of the transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

According to this approach, in particular, any threshold variations caused by high temperature processes and the like may be efficiently avoided, thereby contributing to superior uniformity of sophisticated transistor elements. In the replacement gate approach, the polysilicon material is removed on the basis of appropriate etch recipes, such as wet chemical etch processes, which exhibit a high degree of selectivity with respect to the insulating material that laterally delineate the polysilicon material. After the removal of the polysilicon material, an appropriate metal-containing material is deposited in order to form the work function adjusting species above the gate dielectric material as explained above. Typically, P-channel transistors and N-channel transistors require different types of work function adjusting species, which may require a corresponding masking and patterning regime in order to appropriately form the desired work function adjusting material in the gate electrode structures of P-channel transistors and N-channel transistors, respectively. Irrespective of the applied process strategy after depositing the work function adjusting material layer, at least the actual electrode metal, such as aluminum, has to be filled into the opening, the width of which may, however, be further reduced by the previous deposition of the work function adjusting material, thereby causing significant irregularities, as will be explained with reference to FIGS. 1a-1c.

FIG. 1a schematically illustrates a cross-sectional view of a semiconductor device 100 that comprises a substrate 101, such as a silicon substrate and the like, in or above which is provided a silicon-based semiconductor layer 102. Furthermore, the device 100 comprises a transistor 150, such as a P-channel transistor or an N-channel transistor, that may be formed on the basis of critical dimensions of approximately 40 nm and less. Furthermore, a further circuit element 160, such as a field effect transistor, a capacitor and the like, is provided in the semiconductor device 100 and may be formed on the basis of a greater critical dimension. The transistor 150 comprises drain and source regions 151, possibly in combination with metal silicide regions 152. Similarly, the circuit element 160 comprises "drain and source" regions 161 in combination with metal silicide regions 162. Furthermore, the transistor 150 comprises a gate electrode structure 155 which, in the manufacturing stage shown, includes a gate dielectric material 155A formed on the basis of a high-k dielectric material, as discussed above. Furthermore, a sidewall spacer structure 155C is provided and defines an opening 155O having a width that substantially corresponds to a desired length of the gate electrode structure 155. For example, a width of the opening 155O may be 40 nm and less in sophisticated applications. Similarly, the circuit element 160 may comprise a "gate electrode structure" 165 including a gate dielectric material 165A, a spacer structure 165C, which defines an opening 165O. In principle, the gate electrode structures 155, 165 may have the same configuration except for a different width of the opening 165O compared to the opening 155O. Furthermore, a dielectric material 103, for instance in the form of silicon nitride, silicon dioxide and the like, is provided so as to laterally enclose the gate electrode structures 155, 165.

The semiconductor device 100 as illustrated in FIG. 1a may be formed on the basis of the following process techniques. After forming appropriate semiconductor regions in the layer 102, for instance by providing isolation structures (not shown) for receiving the circuit elements 150, 160, the gate dielectric materials 155A, 165A may be formed on the basis of oxidation and/or sophisticated deposition techniques, wherein, typically, a high-k dielectric material is incorporated in the dielectric materials 155A, 165A. For instance, a silicon oxide-based material may frequently be used as a base layer, possibly in combination with other species, such as nitrogen, on which an appropriate high-k dielectric material, such as hafnium oxide and the like, may be deposited. Thereafter, a conductive cap material may be formed in order to enhance integrity of the gate dielectric materials 155A, 165A during the further processing. Thereafter, polysilicon material is deposited on the basis of well-established process recipes, possibly in combination with further cap materials, hard mask materials and the like, as is required for patterning the resulting material layer stack in accordance with the design rules so as to reliably implement the critical dimensions for the gate electrode structure 155. Thereafter, sophisticated patterning processes are applied in order to obtain the gate electrode structures 155, 165, which include the polysilicon material as a placeholder material. Next, the drain and source regions 151, 161 may be formed in combination with the sidewall spacer structures 155C, 165C in order to obtain the desired dopant profile. Further-more, the spacer structures 155C, 165C may also be used for forming the metal silicide regions 152, 162, thereby completing the basic configuration of the circuit elements 150, 160. Next, the dielectric material 103, also referred to as an interlayer dielectric material, is formed, for instance, by depositing silicon nitride followed by silicon dioxide and the like. Thereafter, any excess material may be removed and an upper surface of the gate electrode structures 155, 165 is exposed, for instance, by a polishing process, such as chemical mechanical polishing (CMP). Next, an etch process, such as a highly selective wet chemical etch process, is performed to remove the exposed polysilicon material selectively to the dielectric material 103 and the sidewall spacer structures 155C, 165C, thereby forming the openings 155O, 165O.

FIG. 1b schematically illustrates the semiconductor device 100 with a metal-containing material layer 155D formed on the dielectric material 103 and in the openings 155O, 165O. The material layer 155D comprises one or more layers of different materials, such as titanium nitride, tantalum nitride and the like, wherein an appropriate metal species, such as lanthanum, aluminum and the like, may also be incorporated in order to adjust the resulting work function of the gate electrode structures 155, 165. As previously discussed, depending on the overall process strategy, different material layers may locally be provided in transistors of different conductivity type, thereby requiring the deposition of at least one or more material layers, possibly in combination with additional etch processes for selectively removing one or more of these layers from gate electrode structures of transistors which may require a different type of work function metal species. Irrespective of the process strategy applied, the material 155D may be deposited on the basis of sophisticated deposition techniques, such as chemical vapor deposition, physical vapor deposition and the like, so as to form the material layer 155D reliably at least above the gate dielectric materials 155A, 165A with a thickness as required for appropriately positioning the work function metal species at and in the dielectric materials 155A, 165A. During the deposition of the material 155D, a significant variation of the layer thickness may be created, which may be particularly pronounced in an upper portion of the opening 155O of reduced critical dimension. Thus, while a width 155W of the opening 155O at the bottom thereof may be defined by the local layer thickness that is selected so as to obtain the desired coverage of the gate dielectric material 155A, a width 155R at the top of the opening 155O may be significantly reduced due to corresponding overhangs of the layer 155D. On the other hand, the reduced width 165R at the top area of the opening 165O may not substantially affect the further processing of the device 100. On the other hand, the reduced width 155R, which may be 20 nm and even less for an initial width of the opening 155O of approximately 40 nm, may result in significant irregularities during the further processing when filling in an actual electrode material into the openings 155O, 165O.

FIG. 1c schematically illustrates the semiconductor device 100 after the deposition of an electrode metal 155E, such as aluminum and the like, in order to complete the gate electrode structures 155, 165. Due to the reduced width 155R (FIG. 1b), the opening 155O may not be completely filled or the opening 155O may even remain substantially non-filled, thereby producing a non-functional gate electrode structure for the transistor 150. On the other hand, the opening 165O may be reliably filled due to the less critical width of the opening 165O. Consequently, upon removing any excess material, the gate electrode structures 155, 165 may be completed, however, with a very pronounced probability of creating non-functional gate electrode structures for critical transistor elements, such as the transistor 150. Thus, although, in principle, the adjustment of the work function of the gate electrode structure 155 in a very advanced manufacturing stage may be advantageous in view of reducing transistor variability in terms of threshold voltage variations, in particular, highly scaled transistor elements may suffer from an increased yield loss due to incompletely filled gate electrode structures or non-functional gate electrode structures.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which a conductive gate electrode material may be filled into an opening of a gate electrode structure on the basis of a superior cross-sectional shape of the opening after the removal of the place-holder material in a replacement gate approach. For this purpose, a width at a top area of the opening may be increased by an appropriate treatment, such as a plasma assisted etch process, a particle bombardment and the like, wherein, at the same time, the bottom of the opening may be protected by a sacrificial fill material, such as an organic material, thereby avoiding undue interaction of the process for increasing the width at the top area and sensitive materials, such as high-k dielectric materials and any cap layers. Thereafter, the work function adjusting metal and the actual electrode metal may be filled in on the basis of the superior cross-sectional shape. In some illustrative aspects disclosed herein, the sacrificial fill material may additionally be used as an efficient mask material so as to avoid the deposition of a work function adjusting metal in certain gate openings, when depositing work function adjusting metal in other gate openings. For this purpose, after increasing the width of at least some gate openings, the sacrificial material may be selectively removed from the gate openings in which the work function adjusting species is to be provided, while, in other gate openings, at least a portion of the sacrificial fill material may be preserved. Thus, the further processing may be continued on the basis of superior cross-sectional shapes of at least some gate openings, while at the same time avoiding the necessity of providing additional conductive etch stop layers for adjusting the work function of N-channel transistors and P-channel transistors, respectively.

One illustrative method disclosed herein comprises forming an opening in a gate electrode structure of a transistor by removing a placeholder electrode material of the gate electrode structure. The method further comprises forming a sacrificial fill material in the opening so as to cover at least the bottom of the opening. Moreover, a width of the opening is increased at a top area thereof in the presence of the sacrificial fill material. Moreover, the sacrificial fill material is removed from the opening and a material layer is formed on sidewalls and the bottom of the opening on the basis of the increased width, wherein the material layer comprises a work function adjusting species. Additionally, the method comprises filling a conductive electrode material into the opening above the material layer.

A further illustrative method disclosed herein comprises forming a first opening in a first gate electrode structure of a first transistor and a second opening in a second gate electrode structure of a second transistor by removing a placeholder electrode material of the first and second gate electrode structures. Moreover, a first sacrificial fill material is formed in the first and second openings and a width of at least one of the first and second openings is increased at a top area thereof in the presence of at least a portion of the first sacrificial fill material in the first and second openings. The method further comprises removing the at least a portion of the first sacrificial fill material from the first opening and forming a first material layer in the first opening and above the at least a portion of the first sacrificial fill material that is formed in the second opening. Furthermore, the at least a portion of the first sacrificial fill material is removed from the second opening and a second material layer is formed in the first and second openings, wherein the first material layer is formed at least at a bottom of the first opening. Finally, a conductive electrode material is filled into the first and second openings.

A still further illustrative method disclosed herein relates to the adjusting of a work function of gate electrode structures. The method comprises forming a sacrificial fill material in a first gate opening and a second gate opening. Additionally, the method comprises increasing a width of a top area of at least the first gate opening in the presence of the sacrificial fill material. Moreover, the sacrificial fill material is removed from the first gate opening and at least a portion of the sacrificial fill material is preserved in the second gate opening. The method further comprises forming a first work function adjusting species in the first gate opening and above the at least a portion of the sacrificial fill material in the second gate opening. Moreover, the method comprises removing the at least a portion of the sacrificial fill material from the second gate opening and forming a second work function adjusting species in the second gate opening and above the first work function adjusting species.

BRIEF DESCRIPTION OF THE DRAWINGS

The disclosure may be understood by reference to the following description taken in conjunction with the accompanying drawings, in which like reference numerals identify like elements, and in which.

Figure 1A:
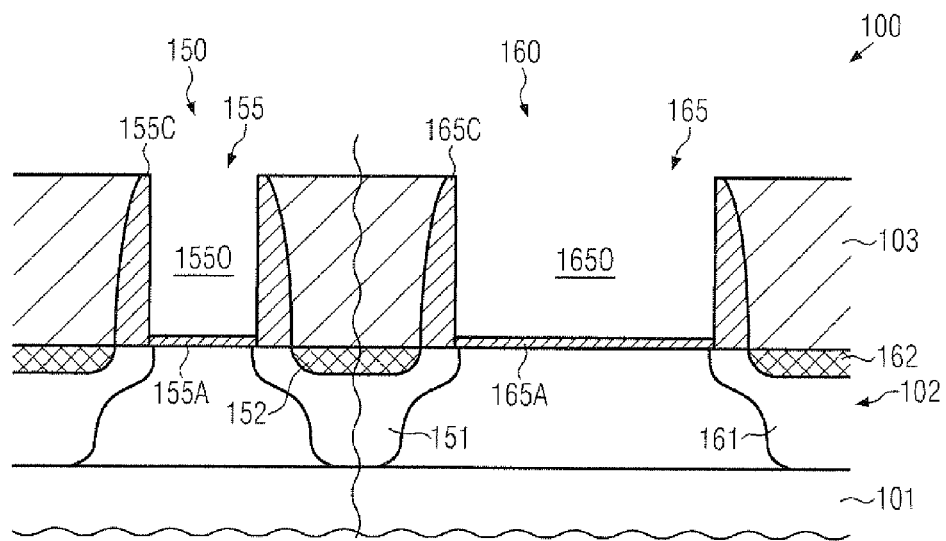
FIGS. 1a-1c schematically illustrate cross-sectional views of a semiconductor device during various manufacturing stages in replacing a polysilicon material with an electrode metal in combination with a work function adjusting species on the basis of conventional replacement gate approaches.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which a sacrificial fill material, such as an organic material, may be efficiently used to protect the bottom area of a gate opening after removing a placeholder electrode material when a width of the gate opening is increased on the basis of an appropriate process technique, such as a plasma assisted etch process, an ion bombardment and the like. Consequently, the further required materials, such as the work function adjusting species, and in particular the actual electrode material, may be filled into the gate opening on the basis of a superior cross-sectional shape, thereby avoiding or at least reducing the occurrence of deposition-related irregularities, such as non-filled gate electrodes or incompletely filled gate electrode structures.

In other illustrative embodiments disclosed herein, the sacrificial fill material may also be used as an efficient mask when depositing and removing a work function adjusting species from above transistors and gate electrode structures, which may require a different type of work function adjusting material. In some illustrative embodiments, the removal of an unwanted portion of the work function adjusting species may additionally be achieved on the basis of a further sacrificial fill material, which may be provided in a gate opening having formed therein a desired work function adjusting material, thereby providing superior integrity of the work function adjusting species. For example, an etch process and/or a polishing process may be applied to remove any exposed portions of the work function adjusting species substantially without affecting this material in one type of gate openings while the other type of gate openings may still be filled with the initially applied sacrificial fill material. In some illustrative embodiments, if desired, a further process for increasing a width of one or both types of gate openings may be performed, for instance, in illustrative embodiments, as a part of the previous material removal process sequence, thereby even further enhancing overall performance of a subsequent deposition process for providing a further metal species and the actual electrode metal.

The sacrificial fill materials may be removed on the basis of well-established etch techniques, which may typically have a high degree of selectivity with respect to other materials in the corresponding gate openings so that the sacrificial fill material may be efficiently removed without unduly affecting the underlying materials. For example, a plurality of polymer materials, which may be applied in a low viscous state, are available and may be used. For instance, appropriate materials may frequently be used as "optical planarization layers" in critical lithography processes and the like. Consequently, such materials may be applied with a high degree of gap fill capability, while at the same time these materials may provide a substantially uniform height level across large areas of the semiconductor substrate. On the other hand, such materials may be readily removed, for instance, by plasma strip processes, wet chemical etch recipes and the like. In some illustrative embodiments, the sacrificial fill material may be removed by radiation treatment, for instance based on laser radiation, flash lamp radiation and the like, in order to "evaporate" the sacrificial fill material with a minimal effect on any underlying materials, such as sensitive high-k dielectric materials and corresponding cap layers. Consequently, the width of a top area of the gate openings may be increased on the basis of appropriate reactive process techniques, such as plasma etching, ion sputtering and the like, thereby achieving a desired degree of corner rounding or tapering of the gate opening prior to the deposition of the work function adjusting species. Due to the superior cross-sectional shape, superior deposition conditions may be encountered after the deposition of the work function adjusting species and after a process sequence for selectively removing a portion of the work function adjusting species from gate electrode structures, which require a different type of work function adjusting species.

Figure 1B:
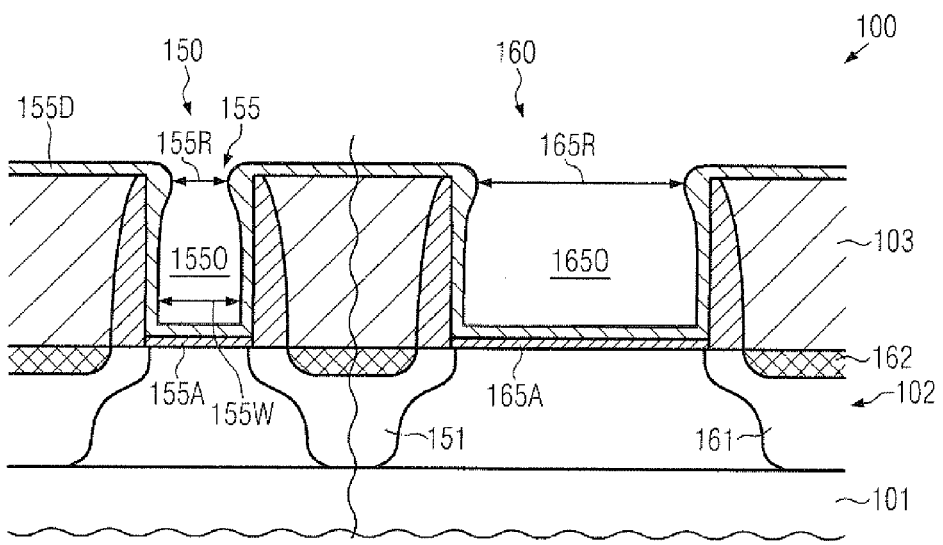
Figure 1C:
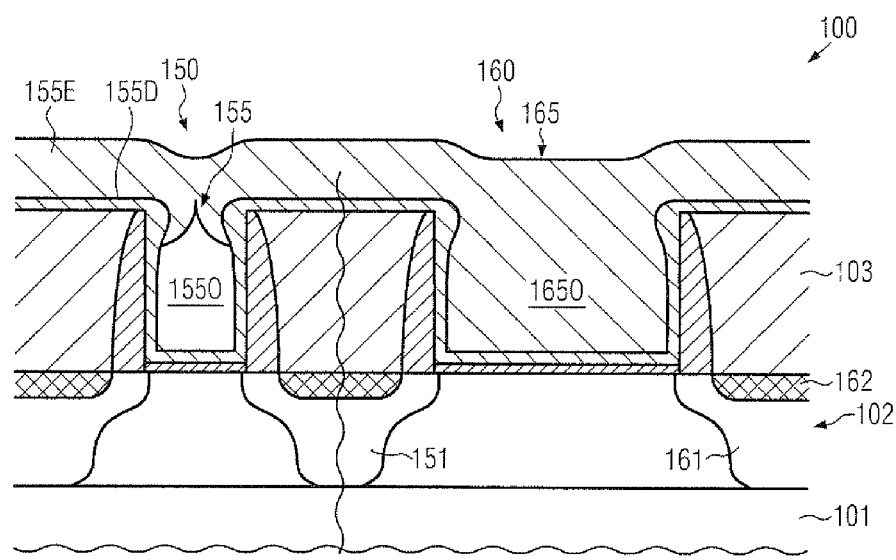

With reference to FIGS. 2a-2m, further illustrative embodiments will now be described in more detail, wherein reference may also be made to FIGS. 1a-1c, if appropriate.

Figure 2A:
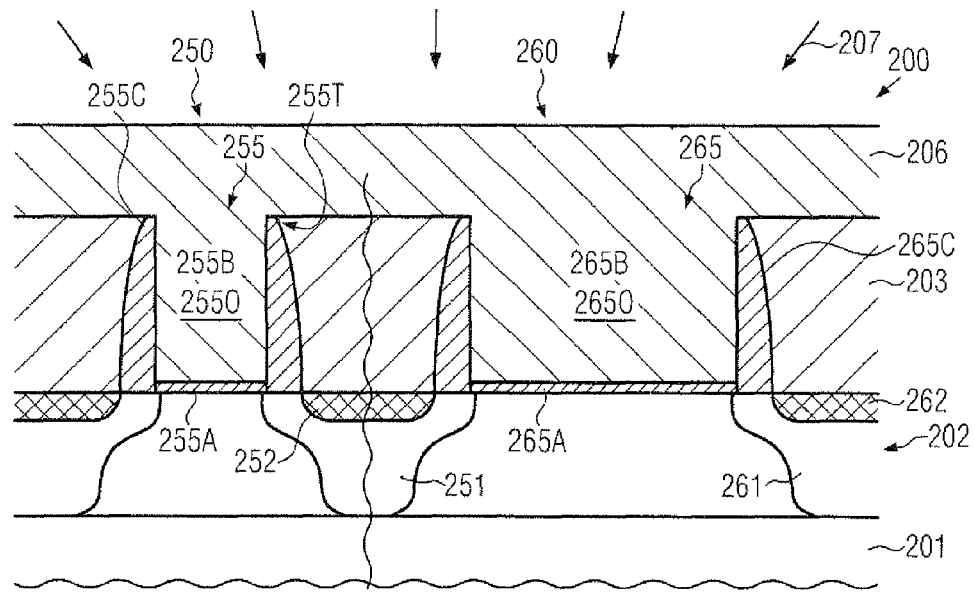
FIGS. 2a-2f schematically illustrate cross-sectional views of a semiconductor device during various manufacturing stages in which a conductive electrode material is filled in openings having formed therein a work function adjusting material layer and having a superior cross-sectional shape obtained on the basis of a sacrificial fill material, according to illustrative embodiments.

FIG. 2a schematically illustrates a cross-sectional view of a semiconductor device 200 comprising a substrate 201 above which may be formed a semiconductor layer 202. The substrate 201 in combination with the semiconductor layer 202 may represent any appropriate material system for forming therein and thereabove circuit elements, such as a transistor 250 and other circuit elements 260, which may represent transistors, capacitors and the like. In the embodiment shown, the transistor 250 may be formed on the basis of critical dimensions that may be less than critical dimensions of the circuit element 260, as is also previously discussed with reference to the semiconductor device 100. Furthermore, the substrate 201 and the semiconductor layer 202 may represent an SOI configuration when a buried insulating layer (not shown) is formed below the semiconductor layer 202.

As previously discussed with reference to the semiconductor device 100, the transistor 250 may comprise drain and source regions 251, possibly in combination with metal silicide regions 252. Similarly, the circuit element 260 may comprise "drain and source" regions 261 in combination with metal silicide regions 262. Moreover, the transistor 250 may comprise a gate electrode structure 255 which may comprise, in the manufacturing stage shown, a gate dielectric material 255A, possibly in combination with a conductive cap material, and a spacer structure 255C. Similarly, the circuit element 260 may comprise a "gate electrode structure" 265 having the components 265A and 265C. Furthermore, corresponding openings 255O, 265O may be provided in the structures 255, 265 and may be filled with a sacrificial fill material 206. The sacrificial fill material 206 may have desired deposition capabilities so as to reliably fill the openings 255O, 265O having significantly different lateral dimensions, which may be accomplished on the basis of available optical planarization materials. Moreover, the sacrificial fill material 206 may be efficiently removed on the basis of very selective etch recipes without unduly affecting the material system 255C. An appropriate material composition for the material 206 may be readily identified by performing test runs for different material compositions, for instance on the basis of available optical planarization materials, in order to determine the deposition characteristics and the etch behavior when exposed to plasma etch recipes, ion sputtering techniques and the like. Furthermore, the removal characteristics of the material 206 may also be determined on the basis of experiments so as to identify appropriate material compositions and etch recipes for removing remaining portions of the sacrificial fill material 206 without unduly affecting the underlying materials 255A, 265A.

The semiconductor device 200 may be formed on the basis of the following processes. The circuit elements 250, 260 may be fabricated on the basis of any appropriate process strategy, as is, for instance, also described above when referring to the semiconductor device 100. That is, after forming an interlayer dielectric material 203 so as to confine the gate electrode structures 255, 265, a surface of these structures may be exposed by any appropriate process technique and, thereafter, a placeholder material, schematically indicated as 255B, 265B, such as polysilicon, silicon/germanium and the like, possibly in combination with additional cap materials and the like, may be removed on the basis of well-established etch techniques. Thereafter, the sacrificial fill material 206 may be provided, for instance, by depositing a polymer material in a low viscous state on the basis of spin coating techniques, wherein the appropriately selected gap fill capabilities may result in an efficient filling of the opening 255O having the critical dimensions. For example, a certain degree of overfill of the openings 255O, 265O may be achieved, thereby resulting in a substantially planar surface topography. After any further treatment of the layer 206, for instance by performing a heat treatment and/or a treatment based on radiation and the like, the desired material characteristics may be adjusted, for instance, in view of chemical resistivity, during the further processing of the device 200 when increasing an initial width of the openings 255O, 265O so as to obtain superior conditions when filling in further materials, such as work function adjusting species and highly conductive electrode materials into the openings 255O, 265O. Next, a material removal process 207, such as an etch process, a polishing process and the like, may be performed to expose the top area 255T of the opening 255O. Similarly, a top area of the opening 265O may be exposed. In the following, it may be referred to the opening 255O since this opening represents the critical component during the further processing, while a corresponding degree of corner rounding in the opening 265O is less relevant. In the embodiment shown, the process 207 may be performed as an etch process, for instance as a wet chemical etch process, a plasma assisted etch process and the like, in order to remove any excess portion of the layer 206.

Figure 2B:
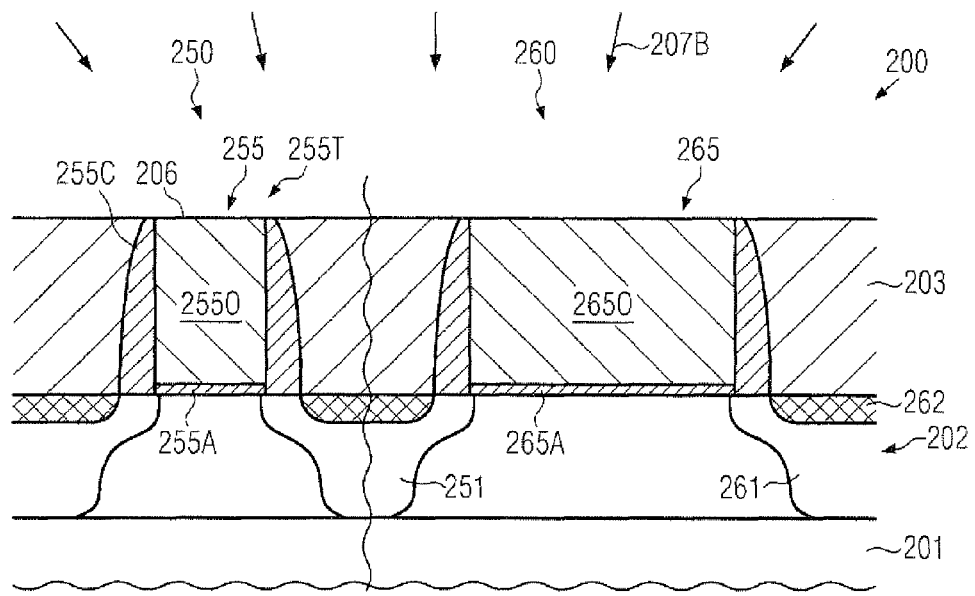

FIG. 2b schematically illustrates the semiconductor device 200 in a further advanced stage of the removal process 207 (FIG. 2a) or in a separate process 207B in which the top area 255T of the gate electrode structure 255 may be exposed and modified in its cross-sectional shape. During the process 207B, also preferably the spacer structure 255C and the interlayer dielectric material 203 at the top area 255T may be attacked.

Figure 2C:
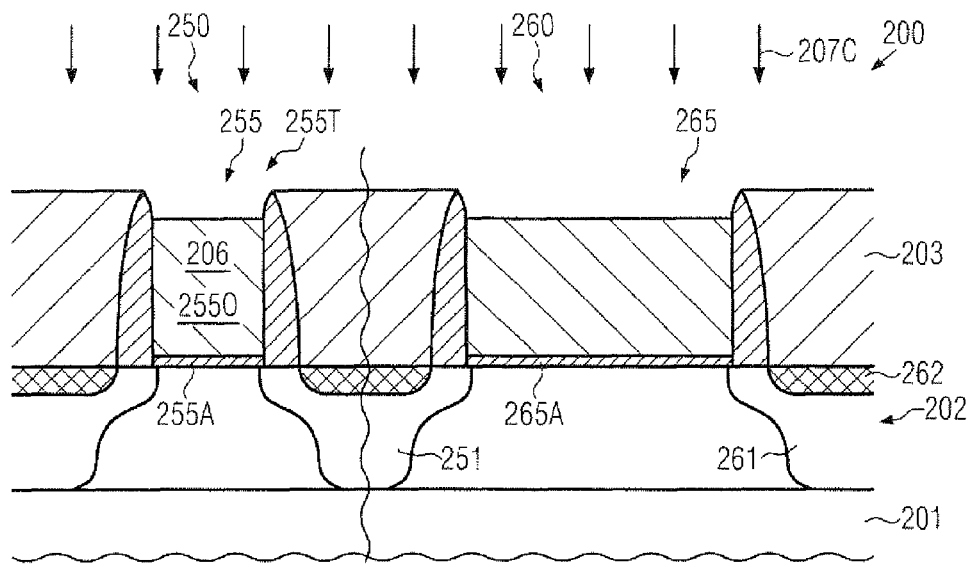

FIG. 2c schematically illustrates the semiconductor device 200 in a further advanced stage or in a separate material removal process 207C that is appropriately configured to initiate material erosion or removal preferably at the top area 255T, thereby increasing the width of the opening 255O at the top area 255T. For this purpose, in some illustrative embodiments, the process 207C may be performed on the basis of a plasma assisted etch recipe in which appropriate reactive substances based on fluorine, chlorine and the like may be applied in order to preferably remove material at the corners of the opening 255O, without unduly removing material of the layer 203. During the process 207C, a portion of the sacrificial material 206 may also be removed, wherein, however, the material 255A may remain reliably protected by at least a portion of the material 206.

In other illustrative embodiments, the process 207C may be performed on the basis of an efficient particle bombardment, such as an ion sputter process, which is to be understood as a process for ionizing gas molecules or atoms and accelerating the ionized particles on the basis of an appropriate acceleration system, thereby imparting sufficient kinetic energy to the particles in order to release atoms from a surface layer of an exposed material. In the top area 255T, i.e., at corners of the opening 255O, the overall material removal may be more pronounced compared to the horizontal portions due to an increased surface area and thus an increased number of incoming energetic ions or neutral particles. Consequently, the width may be increased without unduly removing material from the dielectric material 203, while the remaining portion of the sacrificial material 206 may still reliably protect the material 255A. It should be appreciated that a desired degree of "corner rounding" may be readily adjusted by selecting appropriate process parameters of the process 207C, which may be determined on the basis of experiments using different bombarding species and energies for an ion sputter process in which similar materials and geometries corresponding to the device 200 may be applied.

Figure 2D:
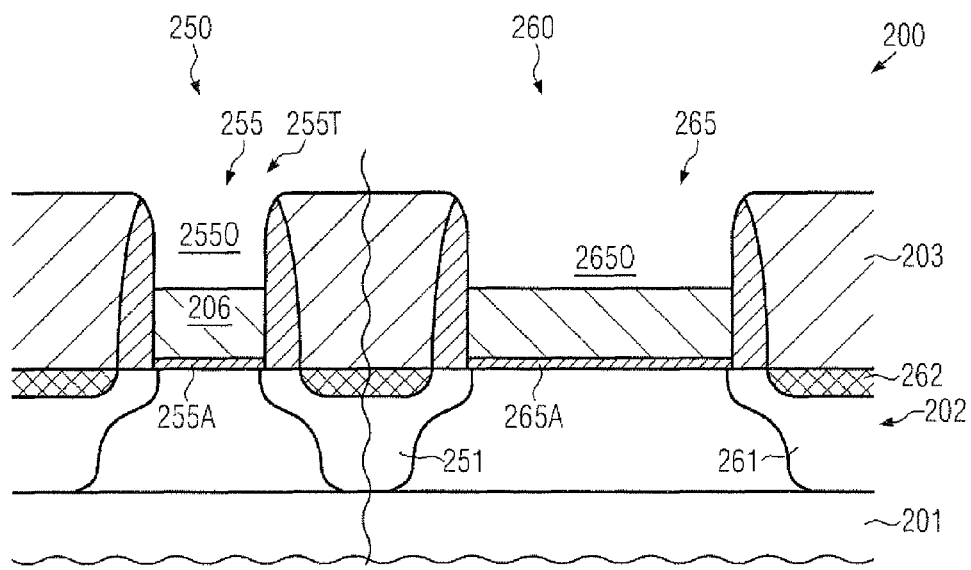

FIG. 2d schematically illustrates the semiconductor device 200 after completing the process 207C of FIG. 2c. As shown, a desired degree of corner rounding at the top area 255T may be obtained so that the increased width may result in a superior cross-sectional shape of the opening 255O in view of the further processing of the device 200. Moreover, in the manufacturing stage shown, a portion of the sacrificial fill material 206 may still be present in the opening 255O and also in the opening 265O.

Figure 2E:
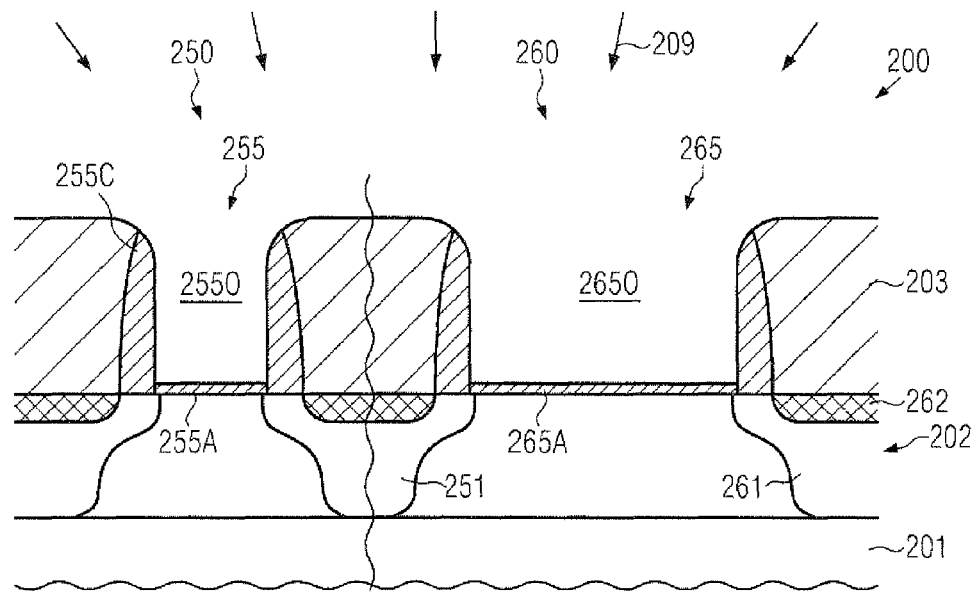

FIG. 2e schematically illustrates the semiconductor device 200 when exposed to a further reactive process ambient 209 in which the remaining portion of the material 206 (FIG. 2d) may be removed from the openings 255O, 265O. As previously discussed, a plurality of organic materials are available which have a high removal rate when exposed to well-known wet chemical or plasma assisted etch processes, while a removal rate for other materials, such as the material 255A and the dielectric material 203 and the spacer 255C, may be significantly less. For example, during the process 209, wet chemical etch recipes, for instance in the form of sulfuric acid and hydrogen peroxide, TMAH (tetramethyl ammonium hydroxide) and the like may be applied in order to efficiently remove the sacrificial fill material 206. In other cases, oxygen-based plasma processes may be applied to remove the remaining portion of the sacrificial fill material 206. For this purpose, appropriate recipes may be readily determined on the basis of experiments. In other illustrative embodiments, the process 209 may be established on the basis of radiation, such as ultraviolet radiation and the like, or on the basis of any other processes in which sufficient energy may be introduced into the remaining portion of the sacrificial material 206 (FIG. 2d) in order to initiate the evaporation of this material without unduly affecting any other material systems, such as the material 255A. In this case, appropriate radiation sources, such as laser sources, flashlight-based sources and the like, are typically available in semiconductor production facilities.

Figure 2F:
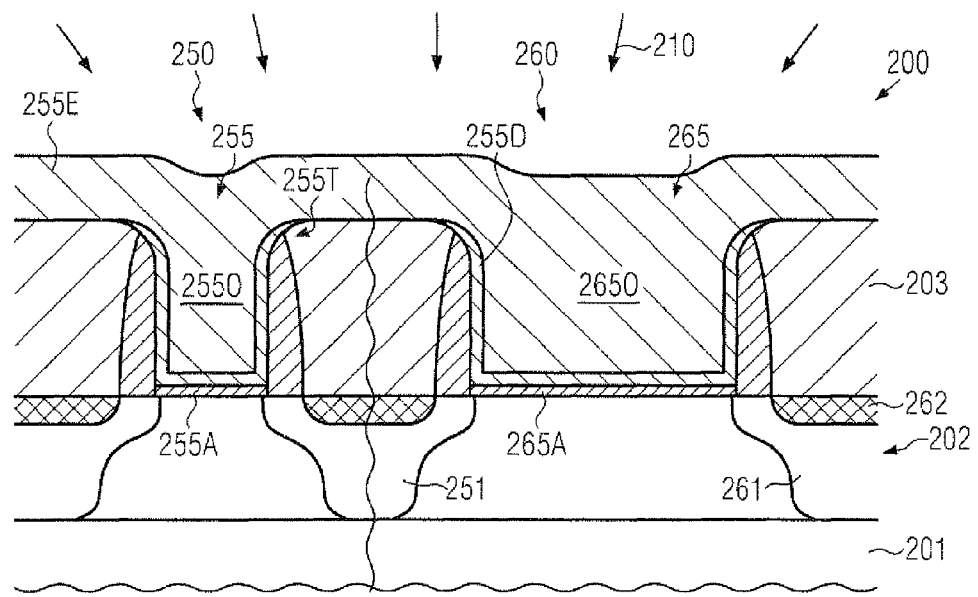

FIG. 2f schematically illustrates the semiconductor device 200 in a further advanced manufacturing stage in which a material layer 255D including a work function adjusting species may be formed in the openings 255O, 265O. The material layer 255D may comprise additional etch stop materials, such as tantalum nitride and the like, in combination with the work function adjusting species if the work function adjusting species is to be removed from other device areas, i.e., from gate electrode structures of transistors of different conductivity type compared to the circuit elements 250, 260. Furthermore, an electrode material 255E, for instance in the form of aluminum or any other appropriate conductive material, may be formed in the openings 255O, 265O with a certain degree of overfill. The material layer 255D, which may comprise two or more individual layers, may be formed on the basis of any appropriate deposition technique, as is also previously explained, wherein the superior cross-sectional shape of the openings 255O, 265O may substantially avoid any undue narrowing of the top area 255T. After the deposition of the layer 255D and a possible patterning thereof, in combination with the deposition of any further work function adjusting species (not shown), the electrode material 255E may be deposited on the basis of any appropriate deposition technique 210. For example, sputter deposition techniques, for instance providing a seed layer, if required, and the like, chemical vapor deposition (CVD) techniques, electro-chemical deposition processes such as electroplating and/or electroless plating, and the like may be applied, possibly in combination, in order to fill the openings 255O, 265O. Due to the superior cross-sectional shape at the top area 255T, having the increased width, a reliable filling of the critical opening 255O may be accomplished, irrespective of the presence of the layer 255D, thereby significantly enhancing overall product uniformity and also contributing to a higher production yield. Thereafter, any excess material of the electrode metal 255E may be removed, for instance, by CMP, during which any unwanted portions of the layer 255D or any other work function adjusting species may also be removed. During the corresponding polishing process, a desired final height of the gate electrode structures 255, 265 and thus a final width at the top area 255T may be adjusted by selecting a certain degree of material removal. For example, by removing a certain surface area, the width of the top area 255T may be reduced, which may be advantageous in device regions comprising a plurality of closely spaced gate electrode structures, thereby reducing the probability of creating leakage paths between adjacent gate electrode structures.

With reference to FIGS. 2g-2m, further illustrative embodiments will now be described in which the sacrificial fill material may be advantageously used in enhancing the cross-sectional shape when providing different types of work function adjusting species for different transistor elements.

Figure 2G:
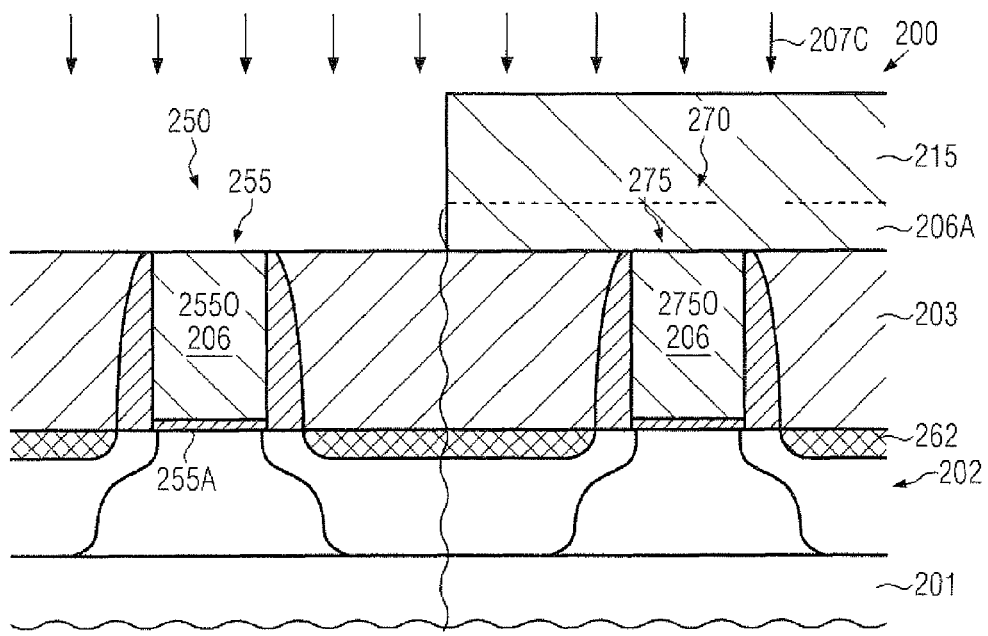
FIGS. 2g-2m schematically illustrate cross-sectional views of a semiconductor device comprising transistors of different conductivity type during various manufacturing stages in adjusting the work function of the gate electrode structures on the basis of a sacrificial fill material, according to further illustrative embodiments.

FIG. 2g schematically illustrates the semiconductor device 200 with the transistor 250 and the gate electrode structure 255 and a second transistor 270 comprising a gate electrode structure 275. The transistors 250, 270 may represent transistors of different conductivity type, such as a P-channel transistor and an N-channel transistor, respectively, which may thus require different work function adjusting species. It should be appreciated that the gate electrode structure 275 of the transistor 270 may have a similar configuration as the gate electrode structure 255, for instance in terms of critical dimensions, gate dielectric materials and the like. Moreover, in the manufacturing stage shown, the sacrificial fill material 206 may be provided at least in the opening 255O and in a corresponding opening 275O. For this purpose, corresponding process techniques may be applied as previously explained. Furthermore, an etch mask 215, such as a resist mask and the like, may be formed above the transistor 270, thereby masking the material 206 within the opening 275O. In other illustrative embodiments, as indicated by the dashed line, a portion 206A of the sacrificial fill material may still be formed above the dielectric material 203, while, in other cases, any excess material of the sacrificial fill material 206 may have been removed on the basis of CMP, etching and the like in order to expose the material 203 prior to forming the etch mask 215. Moreover, the device 200 may be exposed to a reactive process ambient, such as the process 207C, as previously discussed, in order to increase the width of the opening 255O while the material 206 may reliably protect the material 255A. During the process 207C, the etch mask 215 may preserve the material 206, possibly in combination with the portion 206A, above the transistor 270. With respect to process parameters of the process 207C, it may be referred to the embodiments as described above in order to obtain a desired degree of corner rounding.

Figure 2H:
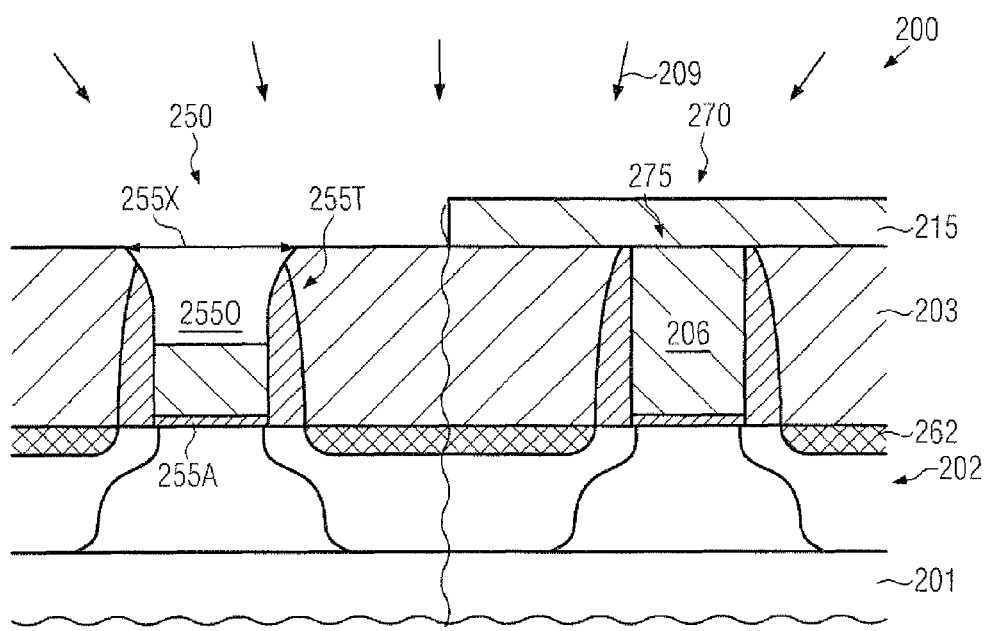

FIG. 2h schematically illustrates the semiconductor device 200 in a further advanced manufacturing stage. As illustrated, the top area 255T may have the increased width 255X obtained on the basis of the process 207C of FIG. 2g, during which a portion of the material 206 in the opening 255O may also be consumed. Similarly, a portion of the mask 215 may have been consumed during the preceding reactive process, depending on the corresponding removal rate of the mask 215. Moreover, the device 200 may be exposed to the etch process 209 so as to remove the remaining portion of the material 206 from the opening 255O. For this purpose, any appropriate etch technique may be applied, as is also previously explained. For instance, wet chemical etch recipes may be applied if considered appropriate. In other cases, the process 209 may be designed to remove the mask 215, for instance, on the basis of oxygen plasma, during which the remaining portion of the material 206 may be removed from the opening 255O. During the process 209, at least a substantial portion of the material 206 within the opening 275O may be preserved, irrespective of whether different etch steps for removing the material 206 from the opening 255O and for removing the mask 215 may be applied. As discussed above with reference to FIG. 2g, the additional portion 206A, if provided, may further provide sufficient process margins during the process 209 in order to reliably maintain a significant portion of the material 206 within the opening 275O.

Figure 2I:
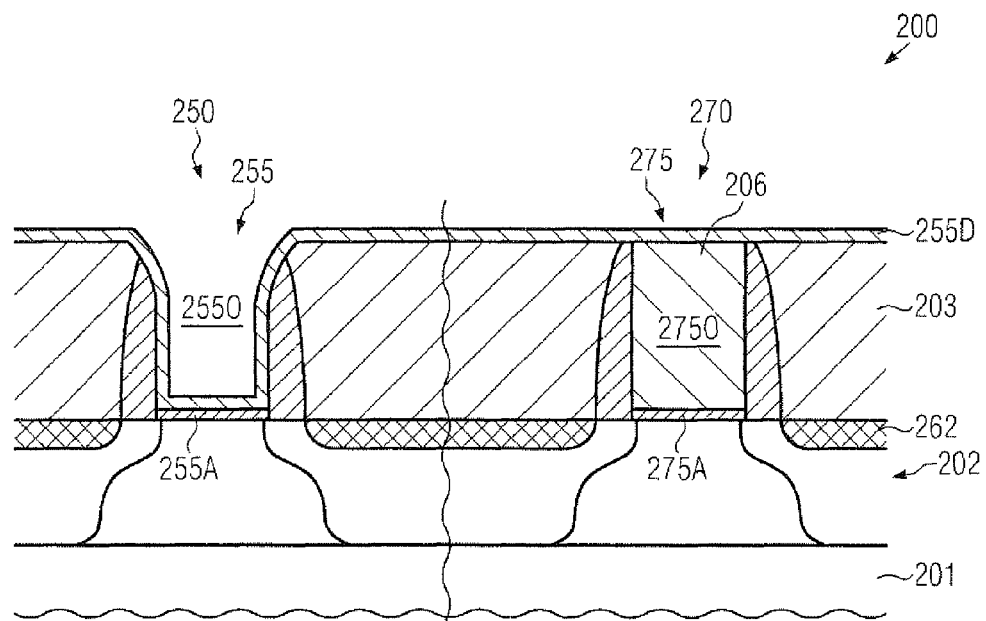

FIG. 2i schematically illustrates the semiconductor device 200 after the deposition of the material layer 255D, which may comprise a work function adjusting species appropriate for the gate electrode structure 255. Due to the superior cross-sectional shape of the opening 255O, the material or materials 255D may be deposited with superior efficiency, while maintaining a superior cross-sectional shape for the subsequent deposition of further materials, such as a further work function adjusting species in combination with a highly conductive electrode material. During the deposition of the material 255D, at least the bottom of the opening 275O may be reliably covered by material 206, thereby avoiding contact of the material 255D with a gate dielectric material 275A of the gate electrode structure 275. It should be appreciated that the material 206 may have sufficient stability for withstanding the conditions of a plurality of deposition processes, such as sputter deposition, low temperature CVD processes and the like, so that the process for forming the material 255D may not be substantially negatively influenced by the presence of the material 206.

In some illustrative embodiments, the material 255D may be removed from above the gate electrode structure 275, which may be accomplished by using CMP, wherein the material 255D may be maintained within the opening 255O, at least at a bottom thereof. Thereafter, an exposed material 206 may be removed from the opening 275O on the basis of any etch process, as specified above, wherein the material 255D in the opening 255O may act as an etch stop material without being unduly affected by the corresponding removal process due to a high selectivity between the material 206 and the material 255D. Thereafter, a further work function adjusting material may be deposited, which may be accomplished in the opening 255O without significantly deteriorating the deposition conditions for a subsequent deposition of an electrode metal, while, in the opening 275O, only a very thin material layer may be deposited, thereby also not unduly affecting the further deposition of the electrode metal.

With reference to FIGS. 2j-2m, further illustrative embodiments are now described in which, additionally, a superior cross-sectional shape may be obtained for the gate electrode structure 275 and/or superior integrity of the material 255D within the opening 255O may be provided.

Figure 2J:
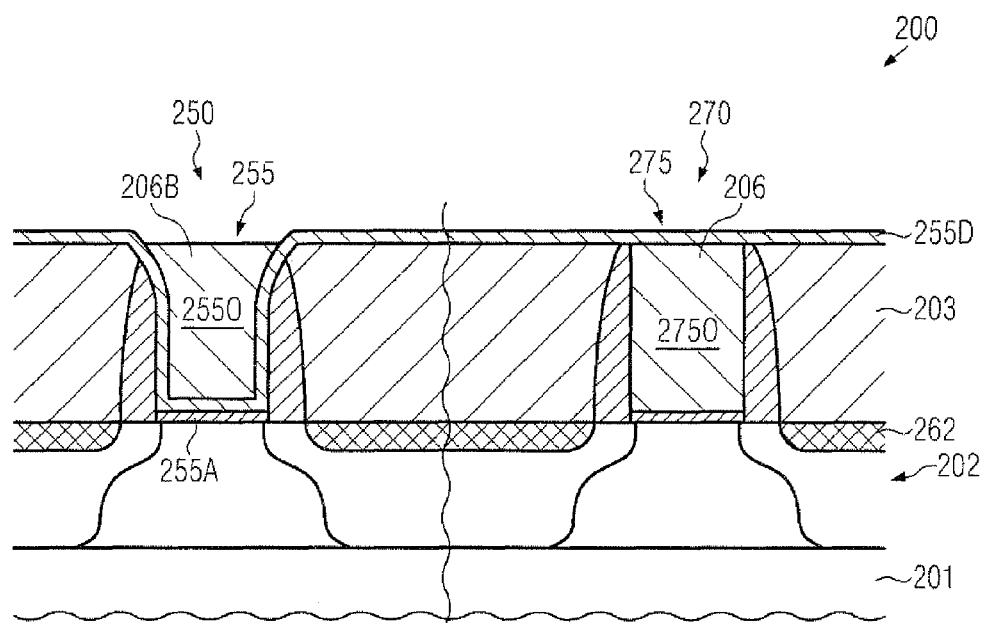

FIG. 2j schematically illustrates the device 200 with a further sacrificial fill material 206B formed in the opening 255O. The material 206B may have substantially the same characteristics as the fill material 206, for instance with respect to gap fill capability, etch behavior and the like. For example, the same material compositions may be used for the materials 206 and 206B. The material 206B may be applied on the basis of any appropriate deposition technique, such as spin coating, possibly in combination with subsequent treatments, and any excess material may be removed, for instance by etching, CMP and the like.

Figure 2K:
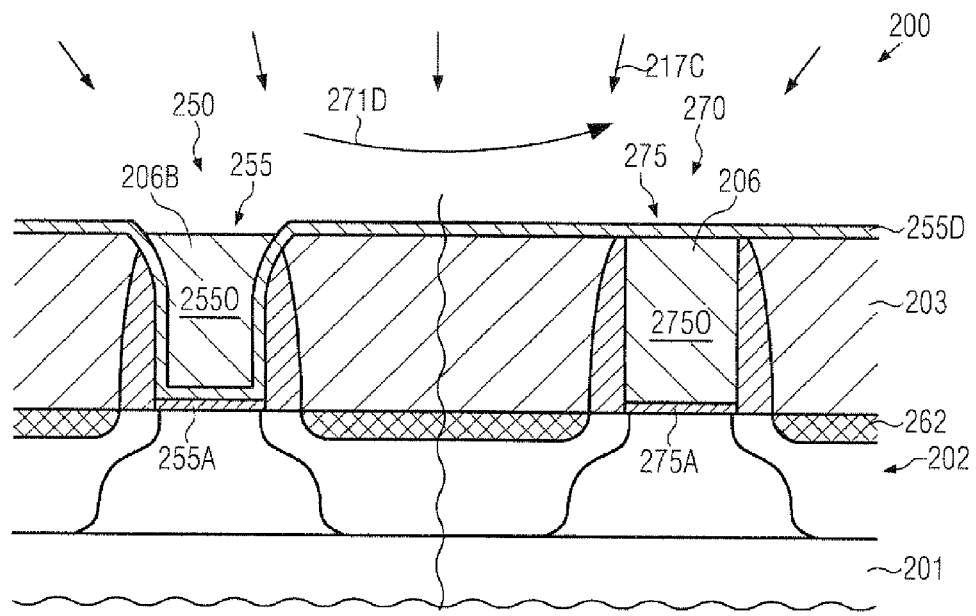

FIG. 2k schematically illustrates the semiconductor device 200 during a material removal process 217C and/or 217D in order to remove exposed portions of the material 255D and/or inducing a certain degree of corner rounding in the gate electrode structure 275. For example, the removal process 217D may represent a CMP process in which exposed portions of the material 255D may be efficiently removed, wherein integrity of the material 255D, at least at the bottom of the opening 255O, may be preserved by the material 206B and wherein integrity of the material 275A in the gate electrode structure 275 may be preserved by the material 206. Additionally or alternatively to the process 217D, the process 217C may be applied, for instance, in the form of an etch process, in order to remove the material 255D and expose the material 206 in the opening 275O. During one or both of the processes 217C, 217D, if desired, a certain degree of corner rounding of the gate electrode structure 275 may also be obtained. In this case, depending on the selected process sequence and the etch stop capabilities of the material 255D, a further rounding of corners of the gate electrode structure 255 may also be accomplished.

Figure 2L:
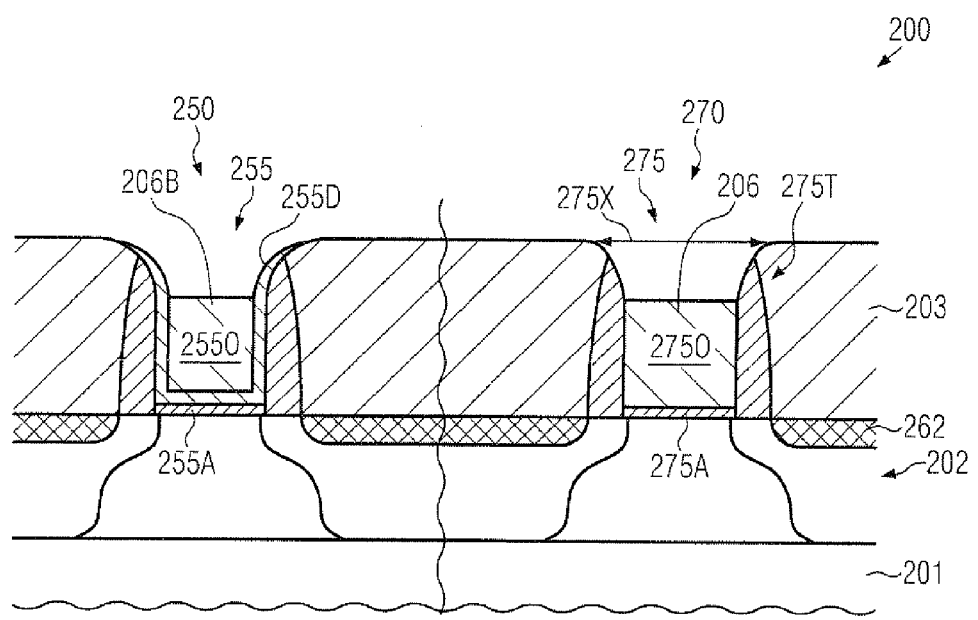

FIG. 2l schematically illustrates the semiconductor device 200 in a further advanced manufacturing stage, i.e., after the removal of a portion of the material 255D. In the embodiment shown, a portion of the material 206B, 206 may also have been consumed during the preceding process sequence and a certain degree of corner rounding may be obtained in the gate electrode structure 275, thereby obtaining an increased width 275X at a top area 275T of the gate electrode structure 275. Consequently, the removal of unwanted portions of the material 255D may be accomplished on the basis of the superior integrity of the remaining portion of the material 255D, at least at the bottom of the opening 255O, while also reliably protecting the material 275A in the opening 275O. Next, the materials 206, 206B may be removed, for instance, on the basis of wet chemical etch recipes, plasma strip processes and the like, as is also previously described. Furthermore, an "evaporation" process may also be applied, as described above, thereby also not unduly affecting any underlying materials, such as the material 255D or the material 275A. After removal of the materials 206B, 206, the further processing may be continued by forming a further work function adjusting material layer that is appropriately selected for obtaining the desired work function of the gate electrode structure 275.

Figure 2M:
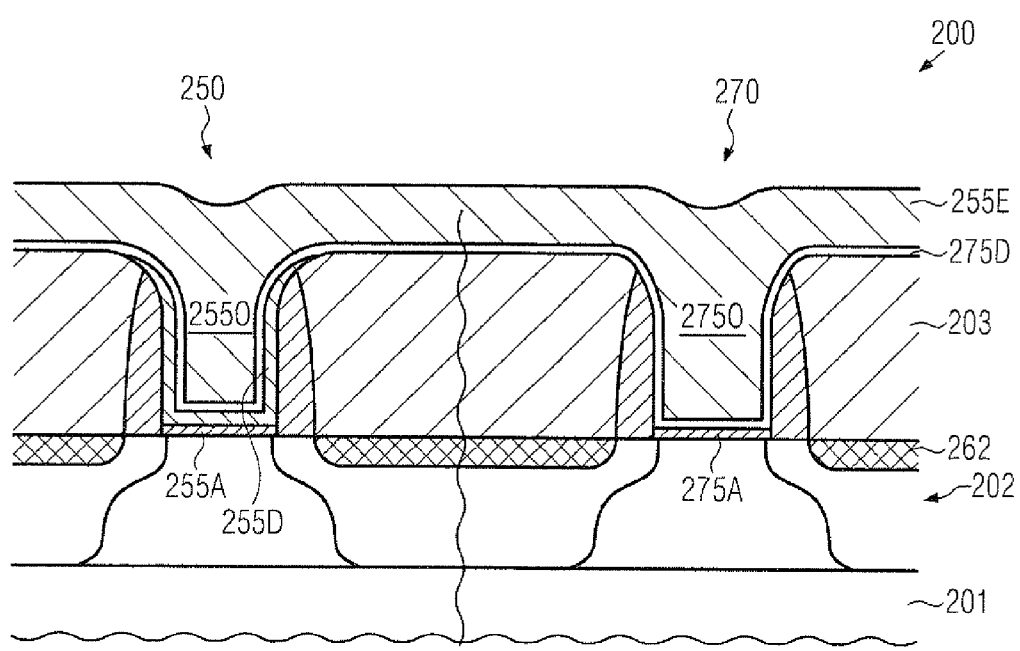

FIG. 2m schematically illustrates the semiconductor device 200 in a further advanced manufacturing stage. As illustrated, a material layer 275D, which may comprise a work function adjusting species for the transistor 270, may be formed in the opening 255O, i.e., on the remaining portion of the material 255D, and in the opening 275O so as to be in contact with the material system 275A. It should be appreciated that, if required, the material layer 255D may comprise a conductive diffusion barrier material, such as titanium nitride and the like, in order to avoid diffusion of a work function adjusting species in the opening 255O towards the material system 255A. In other cases, the material 255D itself may provide sufficient diffusion hindering capabilities so that the work function of the gate electrode structure 255 and thus the threshold voltage of the transistor 250 may be substantially determined by the material 255D. The material layer 275D may be deposited on the basis of any appropriate deposition recipe, wherein the superior cross-sectional shape of the opening 275O may provide superior deposition uniformity, while, on the other hand, the pronounced tapering of the opening 255O may enable a reliable deposition of the material 275D, while at the same time still ensuring superior process conditions during the subsequent deposition of the electrode material 255E. With respect to any deposition technique for providing the electrode material 255E, it may be referred to the embodiments described above. Thereafter, any excess material of the electrode material 255E and of the work function adjusting material 275D may be removed, for instance, by CMP, as is also previously discussed. Consequently, the material 255D may be provided without an underlying etch stop material, such as tantalum nitride, which may frequently be provided so as to enable a selective removal of the material 255D from other gate openings, such as the opening 275O, in conventional strategies. According to the principles disclosed herein, the deposition of the material 255D in the opening 275O may be reliably avoided by the material 206 (FIG. 2l). Consequently, a more reliable adjustment of the work function of the transistors 250, 270 may be accomplished. Thereafter, the material 255E may be filled in on the basis of a superior cross-sectional shape of the openings 255O, 275O.

As a result, the present disclosure provides techniques in which a sacrificial fill material may be advantageously used to obtain a superior cross-sectional shape of at least one type of gate opening prior to filling in a work function adjusting species and an electrode material. In some illustrative embodiments, the sacrificial fill material may also be used as a deposition mask in order to avoid the deposition of one type of work function adjusting species in gate openings in which a different type of work function adjusting species is required. Consequently, replacement gate approaches may be applied to transistor elements of critical dimensions of 32 nm and less while still obtaining a high degree of uniformity of device characteristics and also maintaining a high production yield.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming an opening in a gate electrode structure of a transistor by removing a placeholder electrode material of said gate electrode structure;
   forming a sacrificial fill material in said opening so as to cover at least a bottom of said opening;
   increasing a width of said opening at a top area thereof in the presence of said sacrificial fill material;
   removing said sacrificial fill material from said opening;
   forming a material layer on sidewalls and said bottom of said opening having said increased width at the top area, said material layer comprising a work function adjusting species; and
   filling a conductive electrode material into said opening above said material layer.

2. The method of claim 1, wherein forming said sacrificial fill material in said opening comprises depositing an organic material layer so as to overfill said opening and removing a portion of said organic material layer.

3. The method of claim 2, wherein removing a portion of said organic material layer comprises performing an etch process.

4. The method of claim 2, wherein removing a portion of said organic material layer comprises performing a polishing process.

5. The method of claim 1, wherein increasing a width of said opening at a top area thereof comprises performing a plasma assisted etch process.

6. The method of claim 1, wherein increasing a width of said opening comprises performing a particle bombardment.

7. The method of claim 1, further comprising forming a second opening in a second gate electrode structure, forming said sacrificial fill material commonly in said second opening and said opening and masking said second opening when increasing a width of said opening.

8. The method of claim 7, further comprising preserving at least a portion of said sacrificial fill material in said second opening when removing said sacrificial fill material in said opening.

9. The method of claim 8, wherein said material layer is formed in said opening and above said at least a portion of said sacrificial fill material preserved in said second opening.

10. The method of claim 9, further comprising forming a second sacrificial fill material in said opening to cover a portion of said material layer formed therein and removing an exposed portion of said material layer not covered by said second sacrificial fill material in the presence of said at least a portion of said sacrificial fill material preserved in said second opening.

11. The method of claim 10, further comprising removing said second sacrificial fill material and said at least a portion of said sacrificial fill material and forming a second material layer in said second opening and said opening, wherein said second material layer comprises a second work function adjusting species that differs from said work function adjusting species.

12. A method, comprising:
  forming a first opening in a first gate electrode structure of a first transistor and a second opening in a second gate electrode structure of a second transistor by removing a placeholder electrode material of said first and second gate electrode structures;
  filling said first and second openings with a first fill sacrificial material;
  increasing a width of at least one of said first and second openings at a top area thereof in the presence of at least a portion of said first sacrificial fill material in said first and second openings;
  removing said at least a portion of said first sacrificial fill material from said first opening;
  forming a first material layer in said first opening and above said at least a portion of the first sacrificial fill material formed in said second opening;
  removing said at least a portion of said first sacrificial fill material from said second opening;
  forming a second material layer in said first and second openings, said first opening having formed at least at a bottom thereof said first material layer; and
  filling a conductive electrode material in said first and second openings.

13. The method of claim 12, wherein said first material layer comprises a first work function adjusting species and said second material layer comprises a second work function adjusting species that differs from said first work function adjusting species.

14. The method of claim 12, further comprising removing a portion of said first material layer from above said second gate electrode structure.

15. The method of claim 14, wherein removing a portion of said first material layer comprises forming a second sacrificial fill material in said first opening so as to cover at least a bottom portion of said first material layer in said first opening and performing a material removal process in the presence of said second sacrificial fill material.

16. The method of claim 15, wherein performing said material removal process comprises performing at least one of a polishing process and an etch process.

17. The method of claim 15, wherein performing said material removal process comprises increasing a width of a top area of said second opening.

18. The method of claim 15, further comprising removing said first and second sacrificial fill materials in a common removal process prior to forming said second material layer.

19. A method of adjusting a work function of gate electrode structures, the method comprising:
  forming a sacrificial fill material in a first gate opening and a second gate opening;
  increasing a width of a top area of at least said first gate opening in the presence of said sacrificial fill material;
  removing said sacrificial fill material from said first gate opening and preserving at least a portion of said sacrificial fill material in said second gate opening;
  forming a first work function adjusting species in said first gate opening and above said at least a portion of said sacrificial fill material in said second gate opening;
  removing said at least a portion of said sacrificial fill material from said second gate opening; and
  forming a second work function adjusting species in said second gate opening and above said first work function adjusting species.

20. The method of claim 19, further comprising filling a second sacrificial fill material in said first gate opening after forming said first work function adjusting species and prior to removing said at least a portion of said sacrificial fill material.

* * * * *